United States Patent
Chang et al.

(10) Patent No.: US 6,756,638 B2
(45) Date of Patent: Jun. 29, 2004

(54) MOSFET STRUCTURE WITH REDUCED JUNCTION CAPACITANCE

(75) Inventors: Yao Wen Chang, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 230 days.

(21) Appl. No.: 10/033,748

(22) Filed: Dec. 19, 2001

(65) Prior Publication Data

US 2003/0080352 A1 May 1, 2003

(30) Foreign Application Priority Data

Oct. 29, 2001 (TW) .......................................... 90126667 A

(51) Int. Cl.$^7$ ............................................. H01L 27/01
(52) U.S. Cl. ........................ 257/347; 257/330; 257/382
(58) Field of Search ................................. 257/200, 347, 257/330, 382, 384

(56) References Cited

U.S. PATENT DOCUMENTS 5,925,914 A * 7/1999 Jiang et al. .................. 257/344
6,133,055 A * 10/2000 Yeh .............................. 438/18
6,441,434 B1 * 8/2002 Long et al. .................. 257/347

* cited by examiner

Primary Examiner—Long Pham
Assistant Examiner—(Vikki) Hoa B. Trinh
(74) Attorney, Agent, or Firm—J.C. Patents

(57) ABSTRACT

A MOSFET structure comprises a tortuous gate having a first sidewall and a second sidewall, disposed over a semiconductor substrate. A source region is disposed within the semiconductor substrate adjacent to the first sidewall of the tortuous gate. The source region comprises a broader part and a narrower part. Contacts are positioned above the broader part of the source region and are in contact with the broader part of the source region. A drain region is disposed within the semiconductor substrate adjacent to the second sidewall of the tortuous gate. The drain region comprises a broader part and a narrower part. Contacts are disposed above the broader part of the drain region and are in contact with the broader part of the drain region. The broader part of the drain region is disposed opposite to the narrower part of the source region. The narrower part of the drain region is disposed opposite to the broader part of the source region.

19 Claims, 2 Drawing Sheets

US 6,756,638 B2

MOSFET STRUCTURE WITH REDUCED JUNCTION CAPACITANCE

CROSS-REFERENCE TO RELATED APPLICATION

This application claims the priority benefit of Taiwan application serial no. 90126667, filed Oct. 29, 2001.

1. Field of the Invention

The present invention relates to a semiconductor device. More particularly, the present invention relates to a metal oxide semiconductor field effect transistor (MOSFET) structure with reduced junction capacitance.

2. Description of the Related Art

During a MOSFET device functions, the parasitic junction capacitance of a source/drain region is created at two sides of the depletion region between the source/drain region and the substrate. The junction capacitance is approximately proportional to the area of the source/drain region. The junction capacitance has an adverse effect on the switching speed of a transistor during a logic transition. This is because the junction capacitance will be charged and discharged when each time the transistor switches between logic states, unfavorably slowing down the performance of the transistor.

FIG. 1 depicts a schematic top view of a conventional MOSFET device 18, showing a straight gate electrode 11, symmetric source/drain regions 12 and 13 formed in an active area 17. A plurality of contacts 14 and 15 can be formed above the source/drain regions 12 and 13, respectively.

Still referring to FIG. 1, a dash line 16 shown in the gate electrode 11 represents the width of a channel under the gate electrode 1, while a distance between the source/drain regions 12 and 13 is named as the channel length (not indicated). In this case, the channel width determines the flux of the channel current generated between the source/drain regions 12 and 13. That is, if the channel width becomes smaller as the device is miniaturized, the channel current between the source/drain regions 12 and 13 decreases during an operation, therefore the performance of the device is worse.

SUMMARY OF THE INVENTION

Accordingly, it is an object of the present invention to provide a semiconductor device structure having shrunken source/drain regions so that the junction capacitance can be reduced and the performance of the device can also be improved.

It is another object of the present invention to provide a semiconductor device structure having larger channel width so that the channel current will increase during an operation to improve the performance of the device.

It is a further object of the present invention to provide a semiconductor device structure having shrunken source/drain regions so that the integration of the device can be effectively increased.

According to the objects of the present invention mentioned above, the present invention provides a MOSFET structure comprising a tortuous gate and smaller and asymmetric source/drain regions.

Specifically, the present invention provides a MOSFET structure, comprising a tortuous gate having a first sidewall and a second sidewall, disposed over a semiconductor substrate. A source region is disposed within the semiconductor substrate adjacent to the first sidewall of the tortuous gate. The source region comprises a broader part and a narrower part. Contacts are positioned above the broader part of the source region and are electrically contacted with the broader part of the source region. A drain region is disposed within the semiconductor substrate adjacent to the second sidewall of the tortuous gate. The drain region comprises a broader part and a narrower part. Contacts are disposed above the broader part of the drain region and are electrically contacted with the broader part of the drain region. The broader part of the drain region is disposed opposite to the narrower part of the source region. The narrower part of the drain region is disposed opposite to the broader part of the source region.

In accordance to an aspect of the present invention, a MOSFET device having a tortuous gate structure is provided. Because of the tortuous gate structure, there is a broader part of the source region disposed opposite to a narrower part of the drain region and there is a narrower part of the source region disposed opposite to a broader part of the drain region. Since the area of the broader part of the source/drain region with contacts on it can be close to the corresponding part of a source/drain in the conventional MOSFET and the area of the narrower part of the source/drain region without contact on it can be further reduced, the source and drain region of the device of the present invention can be smaller compared to the conventional MOSFET structure. In other words, asymmetric source/drain regions with smaller areas can be formed. This makes it possible to further reduce the junction capacitance. And the size of the MOSFET device can be reduced, thereby increasing the integration of the IC device.

Another aspect of the present invention is that because of the tortuous gate structure of the present invention, contacts are disposed only on the broader part of the source/drain regions. The area needed for a conductive layer electrically connecting with the contacts over the MOSFET can be smaller compared to the conventional MOSFET structure. Thus the integration of the IC device can be increased.

Yet another aspect of the present invention is that because of the tortuous gate, the channel width can be effectively increased. Because the channel width is increased, the channel current is larger. Thus the performance of the MOSFET device can be substantially enhanced.

It is to be understood that both the foregoing general description and the following detailed description are exemplary, and are intended to provide further explanation of the invention as claimed.

BRIEF DESCRIPTION OF THE DRAWING

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
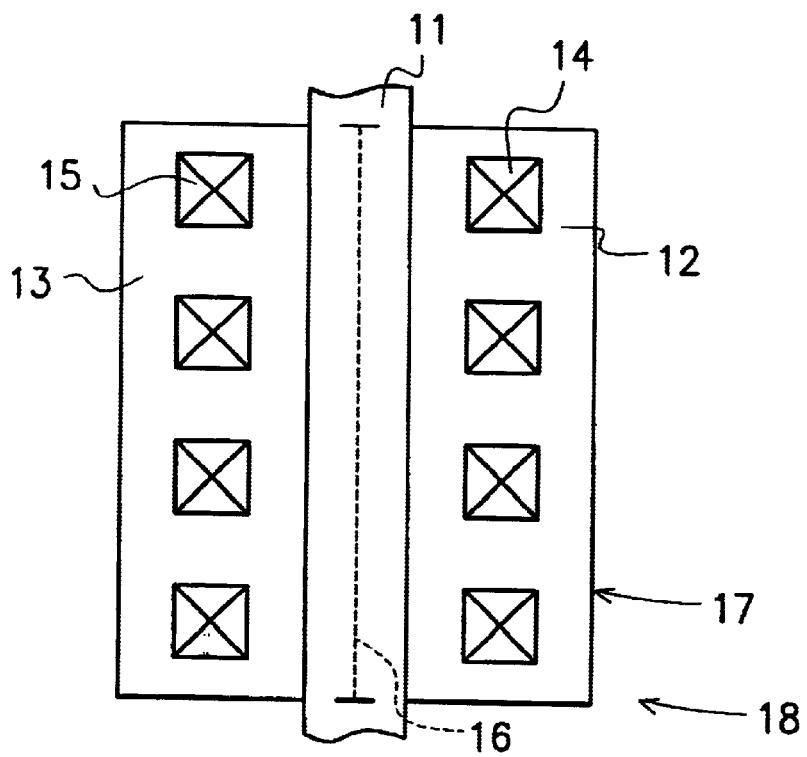
FIG. 1 is a schematic, top view of a conventional MOSFET structure.
Figure 2:
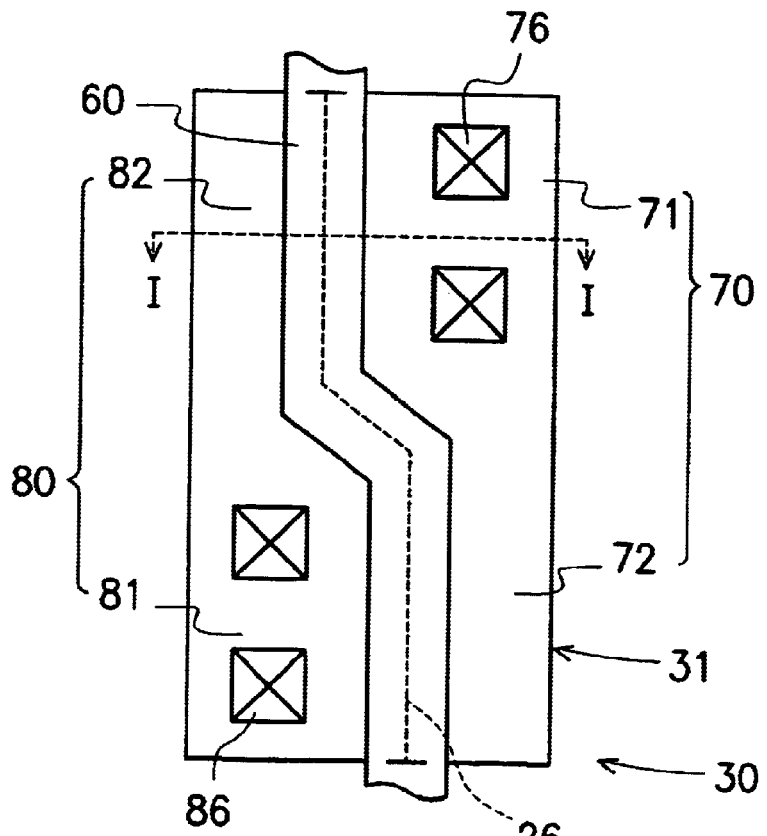
FIG. 2 is a schematic, top view of a MOSFET structure according to a preferred embodiment of the present invention.

FIG. 2 is a schematic, top view of a MOSFET structure 30 according to a preferred embodiment of the present invention. The MOSFET structure 30 comprises a tortuous gate 60 having a first sidewall and a second sidewall, disposed over a semiconductor substrate (not shown). For example, the tortuous gate may be fabricated using conventional fabrication techniques comprising thermally growing a pad oxide layer over the active regions 31 of a P-type substrate to a thickness of between about 10–300 angstroms. A channel threshold adjust implantation is then performed in the typical manner using, for example, boron or boron fluoride ions for NMOS devices or, for example, arsenic or phosphorous ions for PMOS devices to a dose of between about $3\times10^{11}/cm^2$ to about $5\times10^{13}/cm^2$ at an energy of between about 5 to 50 KeV. Next, a conductive layer is deposited over the pad oxide layer. In a preferred embodiment, a polysilicon layer is deposited using a chemical vapor deposition (CVD) method, the polysilicon layer is doped in situ by using appropriate gas species during the deposition process, or alternatively, any other deposition techniques well known to persons skilled in the art may be used. The total thickness of the layers is preferably about 2000–5000 angstroms, but this may be readily varied to form gate structures of different thickness. Next, a conventional photolithography and etching process is carried out to form a tortuous gate structure 60, as illustrated in FIG. 2.

Still referring to FIG. 2, a source region 70 is disposed within the semiconductor substrate adjacent to the first sidewall of the tortuous gate 60. The source region 70 comprises a broader part 71 and a narrower part 72. Contacts 76 are positioned above the broader part 71 of the source region 70 and are electrically contacted with the broader part 71 of the source region 70. A drain region 80 is disposed within the semiconductor substrate adjacent to the second sidewall of the tortuous gate 60. The drain region 80 comprises a broader part 81 and a narrower part 82. Contacts 86 are disposed above the broader part 81 of the drain region 80 and are electrically contacted with the broader part 81 of the drain region 80. The broader part 81 of the drain region 80 is disposed opposite to the narrower part 72 of the source region 70. The narrower part 82 of the drain region 80 is disposed opposite to the broader part 71 of the source region 70. Preferably, the lightly doped portions of the source/drain regions (LDD) are made within the substrate in self-aligned manner by using the gate as a mask.

Figure 3:
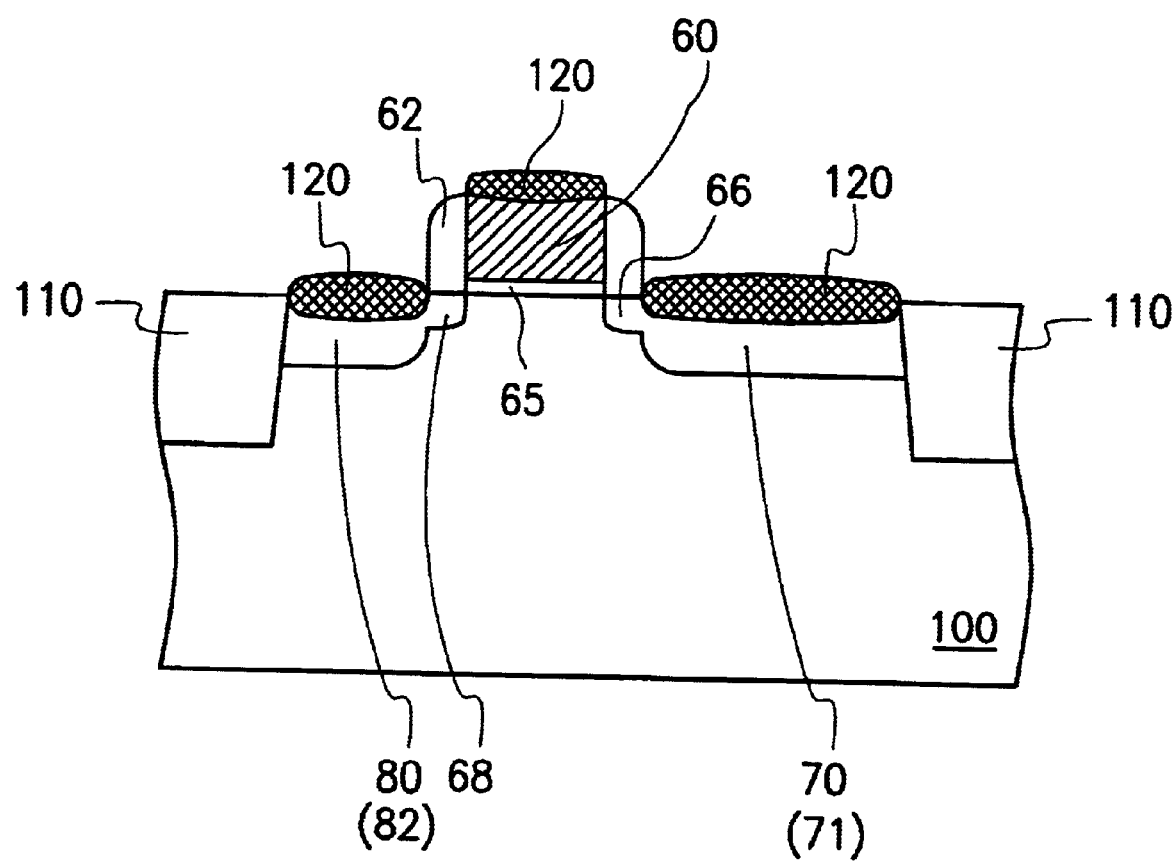
FIG. 3 is a schematic, cross-sectional view of the MOSFET structure along line I—I in FIG. 2.

FIG. 3 depicts a schematic, cross-sectional view of the MOSFET structure along line I—I in FIG. 2, showing the gate 60, spacers 62 being disposed on the sidewall of the gate 60, a gate dielectric layer 65 disposed between the gate 60 and the surface of the substrate 100, and lightly doped source region 66, broader part 71 of the source region 70, lightly doped drain region 68 and narrower part 82 of the drain region 80 being disposed in the substrate 100 on either side of the gate 60. Shallow trench isolation structures 110 are disposed on either side of the resulting gate structure 60. Typically, the lightly doped source/drain regions 66 and 68 (as shown in FIG. 3) implantation is made in the well known manner using implantation of boron or boron fluoride, arsenic or phosphorous ions with a dose of between about $5\times10^{12}/cm^2$ to about $2\times10^{14}/cm^2$ at an energy level of between about 5 to 80 KeV. Heavily doped source/drain regions 70 and 80 are disposed within the substrate 100 and deeper than lightly doped source/drain regions 66 and 68. The heavily doped source/drain regions 70 and 80 are formed by implantation perpendicular to the surface of the substrate 100 using gate spacers 62 as a mask. Typically, the heavily doped source/drain regions 70 and 80 are formed by an implantation of boron, boron fluoride, arsenic or phosphorus ions to a dose of between about $1\times10^{14}/cm^2$ to about $1\times10^{16}/cm^2$ at an energy of between about 5 to 200 KeV. The source/drain regions 70 and 80 are then activated by heating the device to a temperature of between about 800° C. to 1100° C. for between 10 seconds (RTA, higher temperature) and 60 minutes (lower temperature).

By designing a tortuous gate structure and disposing contacts only on the broader part of source/drain regions, it is possible to reduce the area of the narrower part, and consequently smaller and asymmetric source/drain regions can be formed. In doing so, further size reduction of the MOSFET structure can be realized. A dash line 26 shown in the gate 60 represents the width of a channel under the gate 60, while a distance between the source/drain regions 70 and 80 is known as the channel length (not indicated). The channel width 26 of the MOSFET device 30 of the present invention (as shown in FIG. 2) can be longer than that of the conventional MOSFET structure. It is well known that a size reduction of the device would increase the integration of the integrated circuits. Further, a decrease in the area of the source/drain regions decreases the junction capacitance, therefore the performance of the device can be improved.

According to a preferred embodiment of the present invention, the Applicants further proposed disposing metal silicide structures 120 over the gate 60 and the source/drain regions 70 and 80, as illustrated in FIG. 3. Thus, the sheet resistance of the gate 60 and source/drain regions 70 and 80 can be effectively reduced by choosing different thickness and materials for the metal silicide structures 120 for meeting a specific device functionality requirement. It also reduces the side effects caused from the asymmetric contact structure. In other words, the metal silicide structure 120 facilitates optimization of the device performance. In one preferred embodiment, the silicide structures 120 on the gate 60 and the source/drain regions 70 and 80 may comprise of substantially same material. In another preferred embodiment, the silicide structures 120 on the gate 60 and the source/drain regions 70 and 80 may comprise different material.

As is known in the art, the metal silicide layers 120 can be formed by using a number of different metals, including titanium, cobalt, nickel, platinum and palladium. At the present time, titanium silicide is most widely implemented, but both cobalt silicide and nickel silicide are believed to have desirable characteristics for devices with reduced line width. The following description is made in terms of titanium silicide, but other suicides can also be utilized in this process, as is known in the art. A treatment with dilute hydrogen fluoride (HF) solution may be performed to remove native oxides from the surface of the substrate. A thin metal layer is deposited over the device using a physical vapor deposition (e.g. sputtering). The thickness of the metal layer to be deposited is determined by balancing the need to deposit sufficient titanium to form a uniform and desirably conductive titanium silicide layer against the need to leave sufficient silicon below the silicided structures. The excessive consumption of the silicon substrate during silicidation can lead to unexceptable junction leakage from the source/drain regions. Titanium silicide could be formed by performing a rapid thermal annealing (RTA) at a temperature of about 750° C. for about twenty seconds. A subsequent etch removes the unreacted titanium. Titanium nitride, titanium-rich titanium silicide, titanium oxide and unreacted titanium are then etched from the surface of the device in a solution of $NH_4OH$, $H_2O_2$ and $H_2O$ (for example, at a ratio of 1:1:5), leaving titanium silicide layers over the gate and the heavily doped regions of the source/drain regions. Then another RTA at a temperature within a range of about 700° C. to 900°

C. for between about 10 to 60 seconds is carried out to convert the above silicide structures to a lower resistivity phase. Most preferably, the later RTA is performed at a temperature of about 850° C. for about 20 seconds.

Accordingly, the present inventors provide a smaller size MOSFET structure having reduced parasitic junction capacitance so that a MOSFET structure having high operating frequencies, and high integration can be realized.

From the tortuous gate structure 60 of the present invention, the broader part 71 of the source region 70 is opposite of the narrower part 82 of the drain region 80 and the narrower part 72 of the source region 70 is opposite of the broader part 81 of the drain region 80. Since the area of the broader part 71 of the source/drain regions 70 and 80 with contacts on it can be close to the corresponding part of a source/drain in the conventional MOSFET and the area of the narrower part 82 of the source/drain regions 70 and 80 without contact on it can be further reduced, the source and drain regions 70 and 80 in the transistor 30 of the present invention can be smaller compared to the conventional MOSFET structure. In other words, asymmetric source/drain regions with smaller areas can be formed. This makes it possible to further reduce the junction capacitance. And the size of the MOSFET device can be reduced thereby increasing the integration of the IC device.

According to the tortuous gate structure of the present invention, the contacts are disposed on the broader part of the source/drain regions. The area needed for a conductive layer electrically connecting with the contacts over the MOSFET can be smaller compared to the conventional MOSFET structure. Thus the integration of the IC device can be increased.

Because the gate is tortuous, the channel width can be effectively increased. Since the channel width is increased, the channel current becomes larger. The performance of the MOSFET device can be substantially increased accordingly.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A MOSFET structure comprising:
   a substrate;
   a tortuous gate line on the substrate;
   a gate dielectric layer between the tortuous gate line and the substrate; and
   a source region and a drain region in the substrate beside the tortuous gate line, wherein along a longitudinal axis of the tortuous gate line, the source region is broader beside a first segment of the gate line and is narrower beside a second segment of the gate line, and along the longitudinal axis of the tortuous gate line, the drain region is broader beside a second segment of the gate line and is narrower beside a first segment of the gate line, wherein a broader source region is disposed opposite to a narrower drain region and a narrower source region is disposed opposite to a broader drain region.

2. The MOSFET structure of claim 1, wherein at least a contact is disposed on the broader source region and at least a contact is disposed on drain region.

3. The MOSFET structure of claim 1, wherein the material of the tortuous gate line comprises doped polysilicon.

4. A MOSFET structure comprising:
   a substrate;
   a tortuous gate line on the substrate;
   a gate dielectric layer between the tortuous gate and the substrate;
   a source region and a drain region disposed within the substrate adjacent to the tortuous gate, wherein along a longitudinal axis of the tortuous gate line, the source region is broader beside a first segment of the gate line and is narrower beside a second segment of the gate line, and the drain region is broader beside a second segment of the gate line and is narrower beside the first segment of the gate line, wherein a broader source region is disposed opposite to a narrower drain region, and a narrower source region is disposed opposite to a broader drain region; and
   a metal-silicide layer disposed on the tortuous gate and on the source and drain regions.

5. The MOSFET structure of claim 4, wherein at least a contact is disposed on the broader source region and at least a contact is disposed on the broader drain region.

6. The MOSFET structure of claim 4, wherein the material of the tortuous gate line comprises doped polysilicon.

7. The MOSFET structure of claim 4, wherein the material of the metal-silicide layer is selected from the group comprising titanium silicide, cobalt suicide, nickel suicide, and palladium suicide.

8. A metal oxide semiconductor device comprising:
   a substrate;
   a tortuous gate on the substrate;
   a gate dielectric layer between the tortuous gate and the substrate;
   a lightly doped source region, a source region, a lightly doped drain region, and a drain region disposed within the substrate located adjacent to the tortuous gate line, wherein along a longitudinal axis of the tortuous gate line, the lightly doped source region, the source region beside one segment of the tortuous gate line are broader, and the lightly doped drain region, and the drain region are narrower beside the one segment of the tortuous gate line, while along the longitudinal axis of the tortuous gate line, the lightly doped source region, the source region are narrower beside another segment of the tortuous gate line, the lightly doped drain region, and the drain region are broader beside the another segment of the tortuous gate line, wherein a broader doped source region/source region is opposite to a lightly doped drain region/drain region, and a narrower lightly doped source region/source region is opposite to a broader lightly doped drain region/drain region; and
   a first metal silicide layer disposed on the tortuous gate and a second metal silicide layer disposed on the source and drain regions.

9. The metal oxide semiconductor device of claim 8, wherein at least a contact is disposed on the broader source region and at least a contact is disposed on the broader drain region.

10. The metal oxide semiconductor device of claim 8, wherein the material of the gate comprises doped polysilicon.

11. The metal oxide semiconductor device of claim 8, wherein the material of the first metal-silicide layer is selected from one of the group comprising titanium silicide, cobalt silicide, nickel suicide, and palladium silicide.

12. The metal oxide semiconductor device of claim 8, wherein the material of the second metal-silicide layer is selected from one of the group comprising titanium silicide, cobalt silicide, nickel silicide, and palladium silicide.

13. The metal oxide semiconductor device of claim 8, wherein the material of the first metal-silicide layer on the tortuous gate and the material of the second metal silicide layer of the source/drain regions are substantially of same material.

14. The metal oxide semiconductor device of claim 8, wherein the material of the first metal-silicide layer on the tortuous gate is different from that of the second metal-silicide layer on the source/drain region.

15. The metal oxide semiconductor device of claim 8, wherein the material of the first metal-silicide layer is titanium silicide.

16. The metal oxide semiconductor device of claim 8, wherein the material of the second metal-suicide layer on the source/drain region is titanium silicide.

17. A metal oxide semiconductor device comprising:
 a tortuous gate line on the substrate;
 a gate dielectric layer between the tortuous gate line and the substrate; and
 a lightly doped source region, a source region, a lightly doped drain region, and a drain region disposed within the substrate located adjacent to the tortuous gate line, wherein along a longitudinal axis of the tortuous gate line, the lightly doped source region, the source region beside one segment of the tortuous gate line are broader, and the lightly doped drain region, and the drain region are narrower beside the one segment of the tortuous gate line, while along the longitudinal axis of the tortuous gate line, the lightly doped source region, the source region are narrower beside another segment of the tortuous gate line, and the lightly doped drain region, the drain region are broader beside the another segment of the tortuous gate line, wherein a narrower lightly doped source region/source region is opposite to a broader lightly doped drain region/drain region, and a broader lightly doped source region/source region is opposed to a narrower lightly doped drain region/drain region.

18. The metal oxide semiconductor device of claim 17, wherein at least a contact is disposed on the broader source region and at least a contact is disposed on the broader drain region.

19. The metal oxide semiconductor device of claim 17, wherein the material of the gate line comprises doped polysilicon.

* * * * *